United States Patent
Zimmerman et al.

(10) Patent No.: US 8,619,883 B2
(45) Date of Patent: Dec. 31, 2013

(54) LOW SPEED ACCESS TO DRAM

(75) Inventors: David J. Zimmerman, El Dorado Hills, CA (US); Michael W. Williams, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 636 days.

(21) Appl. No.: 12/583,920

(22) Filed: Aug. 24, 2009

(65) Prior Publication Data
US 2009/0316800 A1 Dec. 24, 2009

Related U.S. Application Data

(63) Continuation of application No. 11/174,424, filed on Jun. 30, 2005, now Pat. No. 7,580,465.

(51) Int. Cl.
*H04B 3/00* (2006.01)
*H04L 25/00* (2006.01)

(52) U.S. Cl.
USPC ........... 375/257; 375/219; 375/220; 375/222; 700/117; 711/167

(58) Field of Classification Search
USPC ............. 375/257, 219–222; 327/58; 702/117; 711/167
See application file for complete search history.

(56) References Cited

U.S. PATENT DOCUMENTS

| | | | |
|---|---|---|---|
| 6,510,503 B2 | 1/2003 | Gillingham et al. | |
| 6,833,738 B2 * | 12/2004 | Nakada | 327/58 |
| 6,984,991 B2 * | 1/2006 | Bond et al. | 324/538 |
| 6,996,749 B1 | 2/2006 | Bains et al. | |
| 7,519,891 B2 | 4/2009 | Zimmerman | |
| 2005/0080581 A1 | 4/2005 | Zimmerman et al. | |
| 2007/0089006 A1 | 4/2007 | Zimmerman | |

* cited by examiner

*Primary Examiner* — Phuong Phu
(74) *Attorney, Agent, or Firm* — Schwabe, Williamson & Wyatt, P.C.

(57) ABSTRACT

Embodiments provide access to a memory over a high speed serial link at slower speeds than the high speed serial links regular operation. An embodiment may comprise a memory apparatus with a differential receiver coupled to a protocol recognition circuit, a low speed receiving circuit that has a first receiver coupled with a first input of the differential receiver and a second receiver coupled with a second input of the differential receiver, wherein the low speed receiving circuit is coupled with the protocol recognition circuit, allowing the first and second receivers to access the protocol recognition block at a different frequency than the differential receiver.

7 Claims, 5 Drawing Sheets

_(1)_
LOW SPEED ACCESS TO DRAM

RELATED APPLICATIONS

This application is related and claims priority to U.S. patent application Ser. No. 11/174,424 filed Jun. 30, 2005 and titled "LOW SPEED ACCESS TO DRAM"; this application is entirely incorporated by reference.

BACKGROUND

Semiconductor technologies continue to evolve. Computing and communications designs are incorporating more functionality, higher processing and transmission speeds, smaller sizes, more memory, etc., into smaller and more robust architectures. These trends have placed particular demands on interconnect architectures.

Semiconductor memories in particular are evolving at a rapid pace. Memory devices have reduced power requirements, increased capacities, increased operating frequencies, reduced latencies, etc., all while ramping with the exponential density increases according to Moore's Law. To compensate for the increased capabilities of memories, high-speed serial links can be used to couple memories with memory controllers.

High-speed serial links conventionally require training prior to use. High-speed serial links combine data signals, clock timing, control information, etc. through the same "in-band" link. This may pose a problem as conventional memory devices (e.g., DRAM or host controller) have internal registers that need to be set up prior to link training. Registers may be set for diagnostic purposes or to set operation modes.

Traditionally the internal registers are set by using a separate "out-of-band" interface, typically a serial interface with two to five wires. In pin count constrained applications such as DRAMs this can be a significant problem.

In a conventional DRAM system there are two independent input paths and protocol engines, one each for the in-band and out-of-band interfaces. While memory array data is transmitted through the in-band input path and protocol engine, read data from internal registers is returned to the out-of-band protocol engine and driven back a host controller. This requires a separate IO (input/output) port dedicated to register access. What is needed is a way to access DRAM without requiring link training or a separate IO port.

BRIEF DESCRIPTION OF THE DRAWINGS

Embodiments of the invention may be best understood by reading the disclosure with reference to the drawings, wherein.

DETAILED DESCRIPTION

In the following description, numerous specific details are set forth. However, it is understood that embodiments of the inventions may be practiced without these specific details. In other instances, well-known circuits, structures, and techniques have not been shown in detail in order to not obscure the understanding of this description.

Reference in the specification to "one embodiment" or "an embodiment", etc., means that a particular feature, structure, or characteristic described in connection with the embodiment is included in at least one aspect of the invention. The appearances of the phrase "in one embodiment" in various places in the specification do not necessarily all refer to the same embodiment.

IO architectures are migrating to high speed serial links. High speed serial links may be implemented with differential receivers and transmitters and therefore improve signal integrity and decrease electrical noise.

Figure 1:
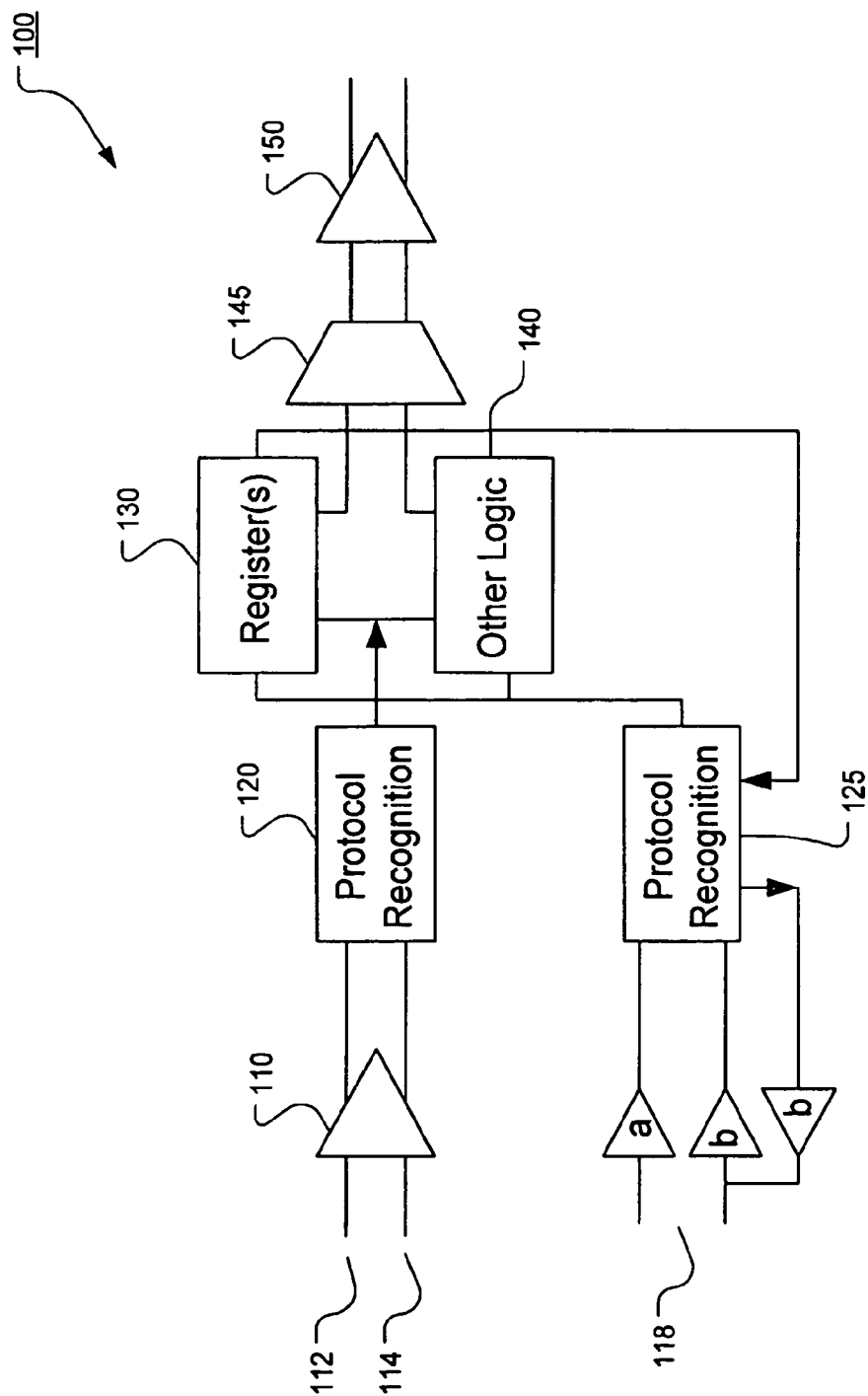
FIG. 1 illustrates a conventional input with a separate dedicated IO port for out-of-band access to a memory.

FIG. 1 illustrates IO circuitry 100 comprising high speed links. IO circuitry 100 may include a differential receiver 110 input with a separate dedicated out-of-band access IO port 118. IO circuitry 100 may use these two independent input paths as well as two independent protocol engines such as protocol recognition block 120 and protocol recognition block 125. A typical protocol recognition block 120 may be a decoder.

Referring to FIG. 1, register(s) 130 and other logic 140 may be accessed through either the high speed differential receiver 110 input or through the separate dedicated out-of-band access IO port 118. In this example, "read" data from the register(s) 130 is returned to the out-of-band protocol engine and driven back the host controller. This out-of-band access method requires additional pins and is much slower than the DRAM array. Data may also be output from IO circuitry 100 by exiting through multiplexer 145 and the high speed differential driver 150.

The example in FIG. 1 may be used to compensate for the increased capabilities of memories, high-speed serial links are used to couple memories with memory controllers, and may send data signals, clock timing, control information, etc. over the same link at high frequencies. However, high-speed serial links conventionally require training prior to use, and conventional memory devices (e.g., DRAM or host controller) have internal registers that need to be set up prior to link training.

A high speed link may be used in a low speed mode to allow access to circuitry behind the link. For example, a high speed differential interface may have additional hardware on each leg of a differential pair and may operate in a low speed mode. An example embodiment may place small receivers on each side of the differential pair.

For example, conventional CMOS-like receivers capable of recognizing low speed inputs can be placed on each side of a differential pair. A memory embodiment may use normal interface pins prior to training as low speed out-of-band inputs, overlaying a traditional serial access method over existing pins. After training, the interface pins may be used for in-band communication.

In an alternative embodiment, inputs may use the existing differential inputs in a low speed mode. In this mode a first leg of a differential pair is connected to an external input and a second leg is connected to a reference voltage. This embodiment could work by having a differential receiver register an input change when a first leg crosses the reference voltage.

In some embodiments, a default state for a link can be the out-of-band mode. This way communication can be established immediately after a reset, after power on, or even failure of in-band communication.

Embodiments may be used in manufacturing on legacy testing equipment, allowing next generation chips, such as memory chips, to be tested on the legacy equipment. Generally, equipment can test a memory array, test the internal logic, and read and write registers even if the equipment does not have an interface that operates at the same frequency as the memory or chip does in its regular operational state.

Figure 2:
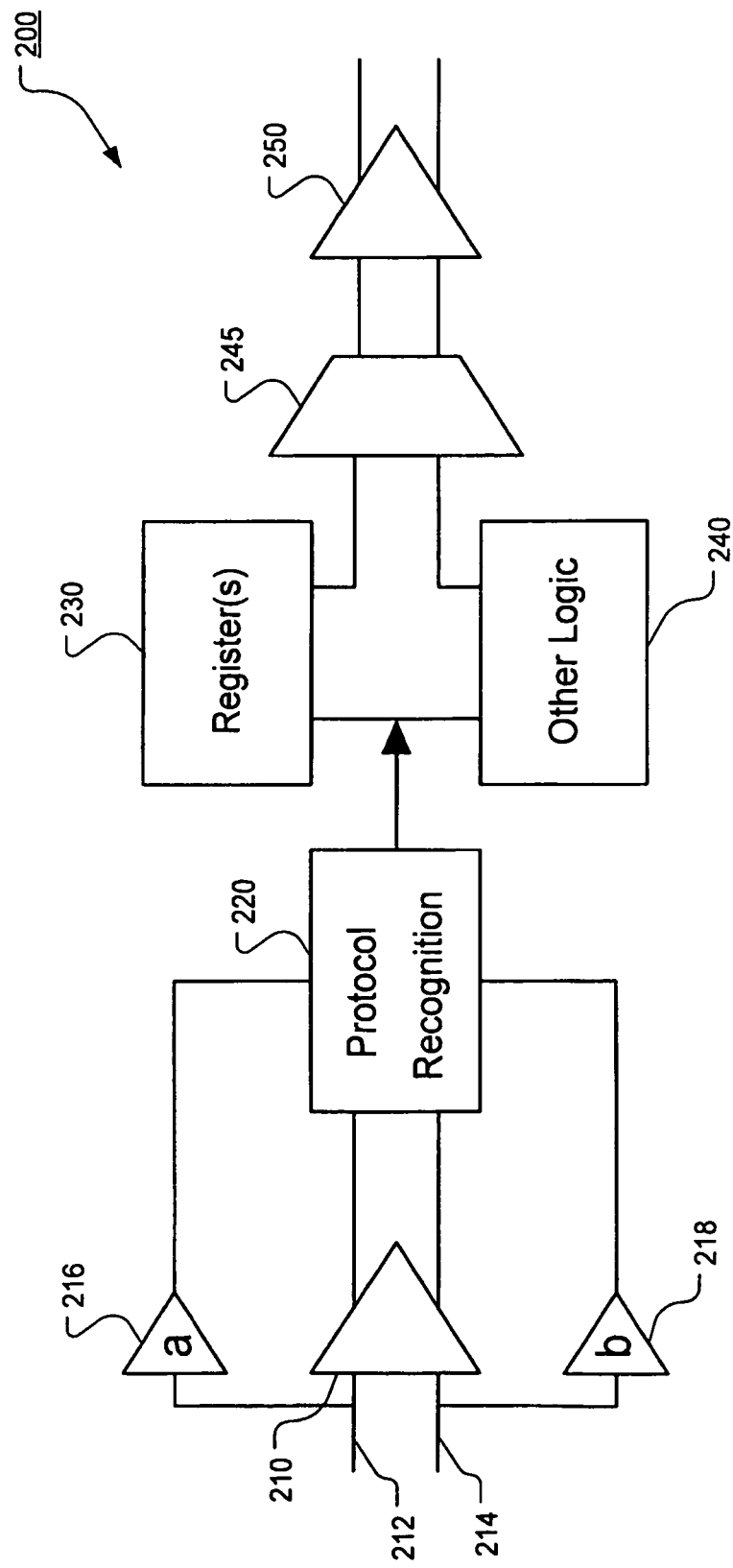
FIG. 2 illustrates a first embodiment high speed serial link memory input with circuitry for using the link for out-of-band access.

FIG. 2 illustrates a first embodiment IO circuit 200 high speed serial link input with circuitry that allows out-of-band access over the link. IO circuit 200 includes a protocol recognition block 220, register(s) 230 coupled with protocol recognition block 220, other logic 240 coupled with the protocol recognition block 220, an output multiplexer 245 coupled to register(s) 230 and other logic 240, the output multiplexer to multiplex the outputs from register(s) 230 and other logic 240 to output differential driver 250 to provide an output from IO circuit 200.

Additionally, IO circuit 200 includes a high speed differential input 210 including two legs 212 and 214. Each leg that is input to differential input 210 may also be coupled with a low speed receiver. Referring to FIG. 2, a first low speed receiver 216 is coupled with input leg 212 of differential input 210 and a second low speed receiver 218 is coupled with a second input leg 214 of differential input 210.

In the present embodiment, the protocol recognition block 220 has additional inputs for the out-of-band signals from receivers 216 and 218. The protocol recognition block 220 has logic for normal operation through differential input 210 and for out-of-band operation through receivers 216 and 218, similar to the logic that would otherwise be required for a serial data recognition.

The present embodiment provides multiple pins for input data and a separate path for output data. Typically the output path will use the existing transmit circuitry in a lower speed mode. In some embodiments this will provide a single ended output instead of the normal differential data, for example, by using one of the output wires from differential driver 250.

An embodiment may include a memory apparatus comprising a differential receiver coupled to a protocol recognition circuit, a low speed receiving circuit comprising a first receiver coupled with a first input of the differential receiver, a second receiver coupled with a second input of the differential receiver, while the low speed receiving circuit may also be coupled with the protocol recognition circuit, the first and second receivers to access the protocol recognition block at a lower frequency than the differential receiver. An embodiment may also comprise an internal register coupled to the protocol recognition block, the low speed receiving circuit to provide access to the internal register.

An embodiment may comprise logic coupled to the protocol recognition block, the low speed receiving circuit to provide access to the logic. In this embodiment, the logic may include a memory array, for example a DRAM memory array.

Figure 3:
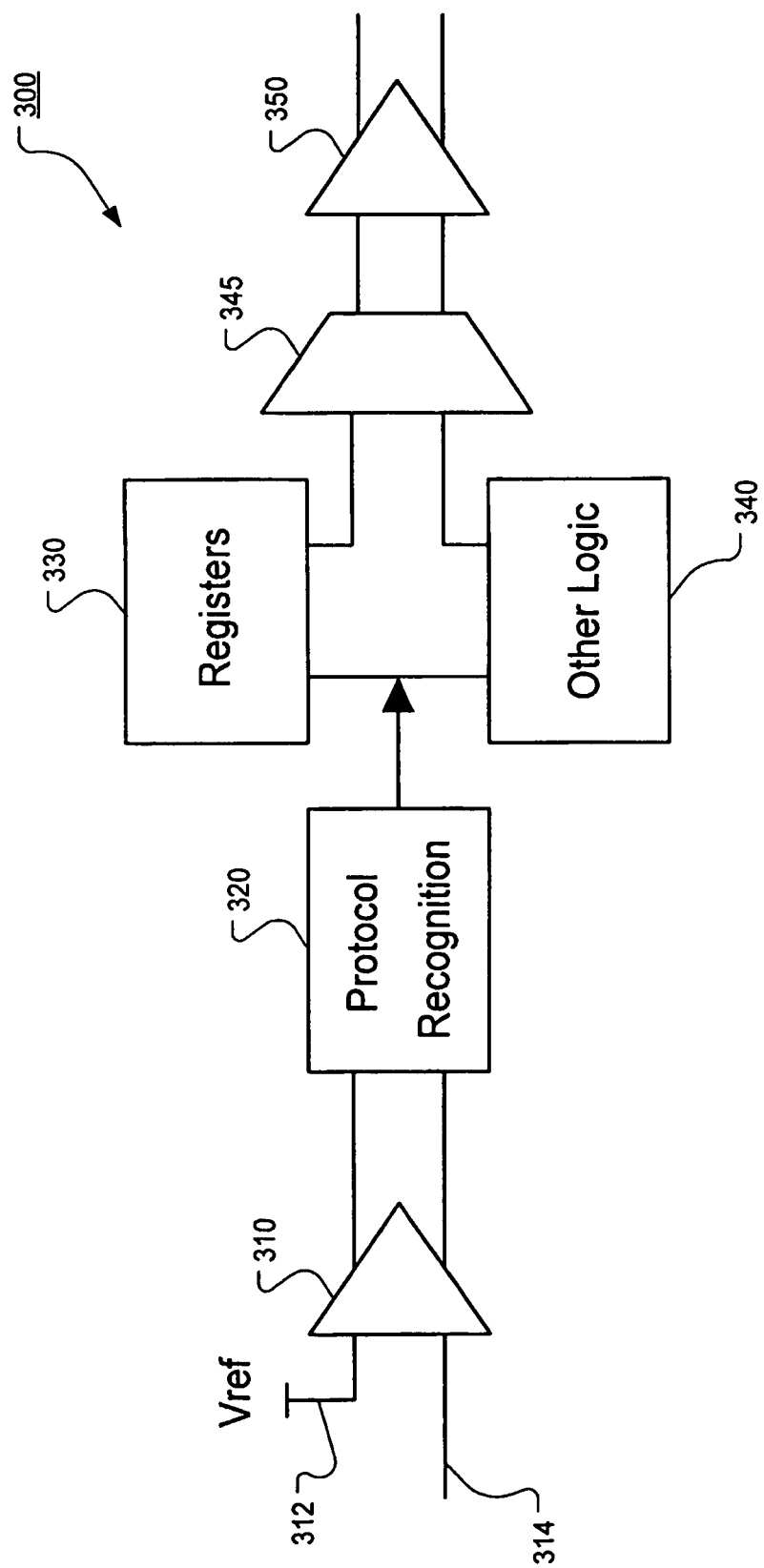
FIG. 3 illustrates a second embodiment high speed serial link input with circuitry for using the link for out-of-band access.

FIG. 3 illustrates a second embodiment IO circuit 300 including a high speed serial link input with circuitry for using the link for out-of-band access. IO circuit 300 includes a protocol recognition block 320, register(s) 330 coupled with protocol recognition block 320, other logic 340 coupled with the protocol recognition block 320, an output multiplexer 345 coupled to register(s) 330 and other logic 340, the output multiplexer to multiplex the outputs from register(s) 330 and other logic 340 to output differential driver 350 to provide an output from IO circuit 300.

Additionally, IO circuit 300 includes a high speed differential input 310 including two legs 312 and 314. One of the input legs may be coupled to a reference voltage and the other leg is used as a low speed input. Referring to FIG. 3, input leg 312 to differential input 310 is coupled to Vref, allowing leg 314 to be used as a low speed input.

An embodiment may be a memory apparatus comprising a differential receiver coupled to an external input to the memory, low speed circuitry to couple a leg of the differential receiver to a reference voltage, and a protocol recognition circuit coupled to the differential receiver and low speed circuitry, the protocol recognition block to receive signals when the low speed circuitry couples the one leg of the differential receiver to a reference voltage.

An embodiment may comprise an internal register coupled to the protocol recognition block, wherein the low speed circuitry can provide access to the internal register through one leg of the differential receiver.

An embodiment may also contain logic coupled to the protocol recognition block, so the low speed receiving circuit to provide access to the logic through one leg of the differential receiver.

Figure 4:
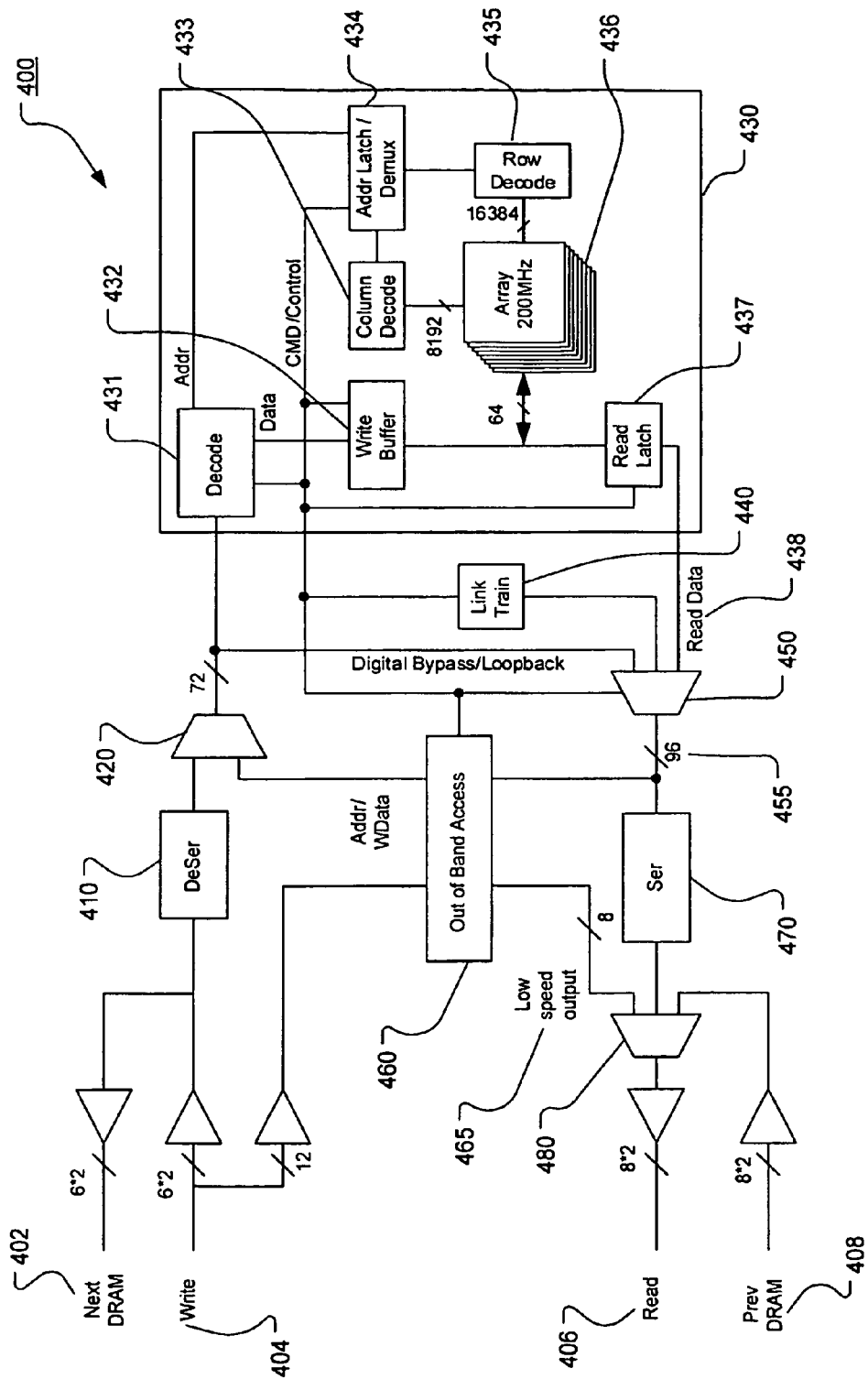
FIG. 4 illustrates an embodiment to allow out-of-band access to a memory array.

FIG. 4 illustrates an embodiment to allow out-of-band access to a memory array. Referring to the figure, a memory 400 may include conventional DRAM architecture 430. DRAM architecture 430 typically has a decoder 431 coupled with an input. The decoder 431 may output data to a write buffer 432 or address information to an address latch/demultiplexer 434. Additionally, decoder may output other command or control information. DRAM architecture also conventionally includes a column decoder 433 and a row decoder 435 that are coupled with the address latch/demultiplexer 434 as well as with the memory array 436. The memory array 436 sends data to read latch 437 and receives data from write buffer 432 by use of a bus.

The embodiment memory 400 in FIG. 4 may also have circuitry to allow out-of-band access to the conventional DRAM array 436 over a high speed interface operating in a low speed mode. For example, write path 404 may be input to receivers and then input to either a deserializer 410 or an out-of-band access block 460. In the present example, the write path also has a link 402 to another DRAM. Deserializer 410 is to take the high frequency data and scale it to a lower frequency, for example, to $\frac{1}{12}$th of the frequency.

In this embodiment, deserializer 410 and out-of-band access block 460 both have an output to multiplexer 420. Out-of-band access block 460 also is coupled with the conventional DRAM architecture 430 and with a control to multiplexer 450, where multiplexer 450 is coupled with the output of input multiplexer 420 by use of a digital bypass/loopback line.

Multiplexer 450 is also coupled with a link training block 440 and with a read data path from DRAM architecture 430. Multiplexer 450 outputs these signals to a line coupled with out-of-band access block 460 and a serializer 470. Serializer 470 basically does the opposite of serializer 410 in that it scales the frequency back up for the read path output.

Referring to the embodiment in FIG. 4, out-of-band access block 460 is coupled through a low speed output 465 to an output multiplexer 480 that also receives high speed signals from serializer 470 as well as a link 408 for read data from a separate DRAM.

The present embodiment may use small receivers on each leg of a differential receiver, for example, assuming a DRAM with 6 input pairs and 8 output pairs, it is possible to create 12 inputs and 8 outputs. In this embodiment it is not required that repeater ports be used although this could provide additional IO. Alternatively the existing IO may be operated at lower speeds. Similar to the second embodiment above, this is possible coupling one side of the differential pair to vref and using the other for an input signal, if this is done with the present embodiment, it will result in only 6 inputs rather than 12.

As an example, a DRAM access may use 9 bits of information for command, 15 bits for a row address, 11 bits for column a address and 8 bits for data. The minimum DRAM cycle time is expected to be 5 ns. If a memory write uses 9+15+11+8=43 bits of input data over 12 wires, this works out to 4 (rounded up) accesses. Considering a DRAM array cycle time is 5 ns, a maximum input data rate would be 4/5 ns=800 Mhz. Reads are somewhat simpler, since they need deliver only the CA information.

In an example read, the DRAM may send back 8 bits of data on the output lines in response. The minimum data rate will be dependent on DRAM design but an example data rate may be 1/8th or 1/4 of the maximum rate.

The same principle applies to bi-directional high speed interfaces. Bi-directional high speed interfaces may use some communication to control the direction of the bus at a given point in time.

Referring back to FIG. 4, a low speed path in the write input 404 may run effectively in parallel to the regular write path and in the present example may convert the input data into 12 single ended inputs to out-of-band block 460. In this case, out-of-band block 460 may be an initial decode logic. Out-of-band block 460 might determine, for example, if the read operation is trying to access a register, or access the DRAM array.

As an example, if an operation is accessing the array, the low speed path from write path 404 may input the 12 bits of input to out-of-band access block 460, which would then determine the operation is accessing the array and send the data to multiplexer 420 to then follow the same path to the array as if the data cam in the high speed port.

Similarly, the low speed path may be used for a read operation. In this case, read data 438 may be input into multiplexer 450 that outputs the read data onto 96 pins in parallel that operate at a relatively low speed. In a conventional operation this read data would run through serializer 470 and its frequency may get increased, for example to a 4 gigahertz frequency, and then passed out the read path 406.

In the case of low speed access, instead of having the read data 438 exit the multiplexer 450 and be input into serializer 470, it may bypass the serializer, be sent through the out-of-band access block 460, and then be sent as 8 bits of data through multiplexer 480 and be transmitted out read path 406.

An embodiment may be a system comprising a memory apparatus with a differential receiver coupled to a protocol recognition circuit, a low speed receiving circuit comprising a first receiver coupled with a first input of the differential receiver and a second receiver coupled with a second input of the differential receiver, the low speed receiving circuit coupled with the protocol recognition circuit, the first and second receivers to access the protocol recognition block, and also a display device coupled with the memory apparatus, the display device to display information from the memory.

In an embodiment, the different inputs may be connected to a single protocol engine. This allows use of similar logic for in-band and out-of-band access. In an embodiment, the low speed protocol can be designed to be similar to the high speed protocol to maximize logic re-use.

Some embodiments may provide a higher bandwidth than the conventional out-of-band access methods. For example, SMBus, a popular two wire serial interface, has a bandwidth of 100KHz. The present embodiment is capable of operation to at least 200 MHz.

In some embodiments, there are more pins available for low speed transfers. A DRAM with 6 input pairs and 8 output pairs can use 12 wires for out-of-band input data and 8 for output data. These wires could be configured, for example, to carry a 10 bit register address and a 2 bit command followed by one or more transfers of 8 to 12 bits of write data. Read data could be returned on 8 output wires.

In some embodiments, a host controller can use receiver, transmitter and protocol circuits similar to those on the DRAM or other attached logic. Conventional out-of-band access methods use a multi-drop bus architecture, which requires voting logic or other methods to define which bus agent will send and which agent(s) will receive data. Embodiments may therefore be designed for use over in-band interfaces. These interfaces are, by nature, point to point. Re-use of existing wires also solves the problem of bus agent negotiation.

Figure 5:
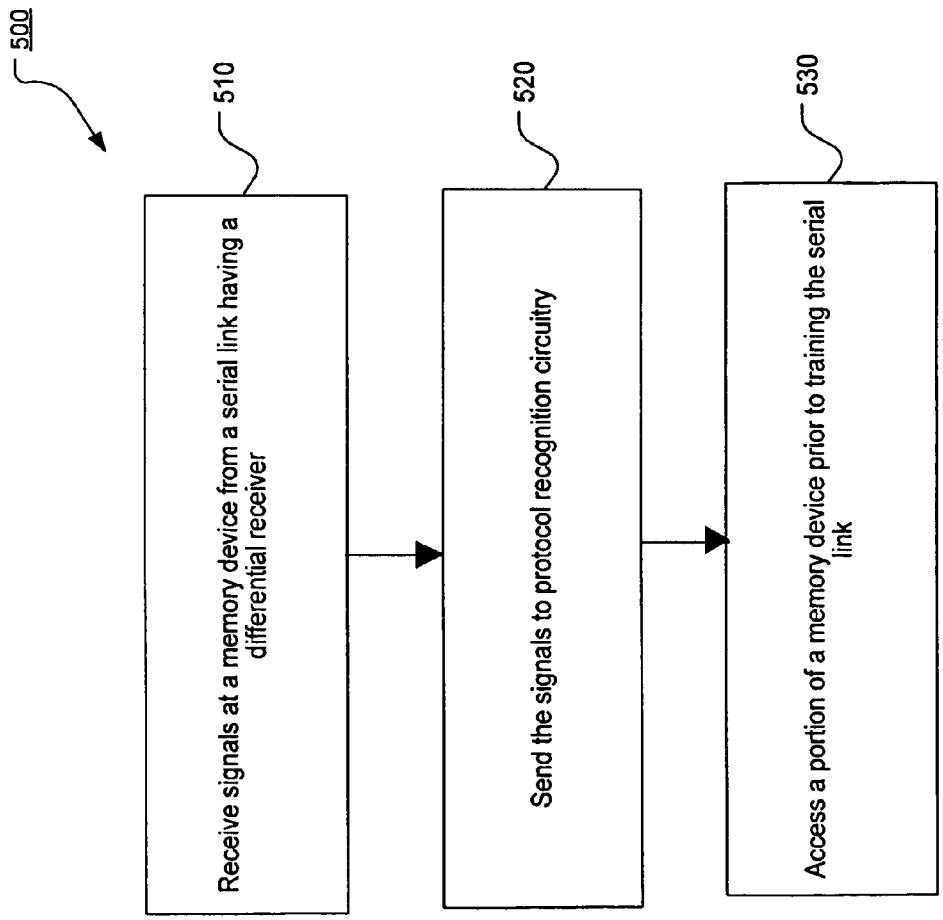
FIG. 5 is a flowchart illustrating an embodiment method to allow out-of-band access to a memory array.

FIG. 5 is a flowchart illustrating an embodiment method 500 to allow out-of-band access to a memory array. This embodiment method may include receiving signals at a memory device from a serial link having a differential receiver as shown in 510, sending the signals to protocol recognition circuitry in 520, and accessing a portion of a memory device prior to training the serial link as illustrated in 530.

The present invention may be embodied in other specific forms without departing from its spirit or essential characteristics. The described embodiments are to be considered in all respects only as illustrative instead of restrictive or limiting. Therefore, the scope of the invention is indicated by the appended claims rather than by the foregoing description. All changes, modifications, and alterations that come within the meaning, spirit, and range of equivalency of the claims are to be embraced as being within the scope of the appended claims.

The invention claimed is:

1. An apparatus, comprising:
at least one receiver, coupled to an inbound differential interconnect, the inbound differential interconnect including a first wire and a second wire, the inbound differential interconnect to transport at least an out-of-band (OOB) signal at a first frequency and a non-OOB signal at a second frequency, wherein the first frequency is lower than the second frequency;
the at least one receiver to detect the OOB signal at the first frequency; and
at least one driver, coupled to the at least one receiver, to transport at least the OOB signal at the first frequency and the non-OOB signal at the second frequency on an outbound differential interconnect.

2. The apparatus of claim 1, wherein the at least one receiver comprises at least one differential receiver.

3. The apparatus of claim 2, wherein the first wire, at a location prior to the coupling with the at least one receiver, is pulled up to a voltage.

4. The apparatus of claim 1, wherein the at least one receiver includes a single-ended output.

5. The apparatus of claim 1, wherein the at least one driver comprises at least one differential driver.

6. The apparatus of claim 5, wherein the at least one driver is coupled to the differential interconnect at a location after an output of the at least one receiver.

7. The apparatus of claim 1, wherein the at least one receiver comprises at least one single-ended receiver.

* * * * *